(12) United States Patent
Gansohr et al.

(10) Patent No.: US 7,003,429 B2
(45) Date of Patent: Feb. 21, 2006

(54) METHOD FOR CALCULATING THE OPERATING TIME OF HYDRAULIC COMPONENTS

(75) Inventors: Marcus Gansohr, Salem (DE); Otto Ebner, Friedrichshafen (DE); Klaus Schweiger, Friedrichshafen (DE); Matthias Winkel, Weingarten (DE); Christoph Rüchardt, Bodolz (DE); Andreas Schwenger, Wolfsburg/Reislingen (DE); Thomas Knoblauch, Saarbrücken (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 36 days.

(21) Appl. No.: 10/498,772

(22) PCT Filed: Dec. 10, 2002

(86) PCT No.: PCT/EP02/13978

§ 371 (c)(1),
(2), (4) Date: Jun. 15, 2004

(87) PCT Pub. No.: WO03/052931

PCT Pub. Date: Jun. 26, 2003

(65) Prior Publication Data

US 2005/0033552 A1 Feb. 10, 2005

(30) Foreign Application Priority Data

Dec. 15, 2001 (DE) ................. 101 61 742

(51) Int. Cl.
*G04F 1/00* (2006.01)
*G04F 10/00* (2006.01)

(52) U.S. Cl. ...................................... 702/176
(58) Field of Classification Search ........... 702/125, 702/114, 115
See application file for complete search history.

(56) References Cited

U.S. PATENT DOCUMENTS

| 4,476,532 A | 10/1984 | Akiyama et al. |
| 4,947,734 A | 8/1990 | Fujita et al. |
| 4,964,050 A * | 10/1990 | Yakuwa et al. ............. 701/102 |
| 5,177,965 A | 1/1993 | Nikolaus |
| 6,157,671 A | 12/2000 | Young |
| 6,856,879 B1 * | 2/2005 | Arakawa et al. ............. 701/50 |

FOREIGN PATENT DOCUMENTS

| DE | 32 27 264 C2 | 1/1990 |
| DE | 39 43 357 A1 | 7/1991 |
| DE | 41 38 225 A1 | 5/1993 |
| DE | 92 17 999.1 | 7/1993 |
| DE | 38 12 672 C2 | 9/1995 |
| DE | 199 29 431 A1 | 12/2000 |

* cited by examiner

*Primary Examiner*—Michael Nghiem
*Assistant Examiner*—Demetrius Prettlow
(74) *Attorney, Agent, or Firm*—Davis & Bujold, P.L.L.C.

(57) ABSTRACT

An operating time is determined by an approximation method within the scope of the method for determining the actual operating time of a hydraulic, electrohydraulic or electric component of a motor vehicle or of a working machine within a reference time or a monitoring period.

4 Claims, 2 Drawing Sheets

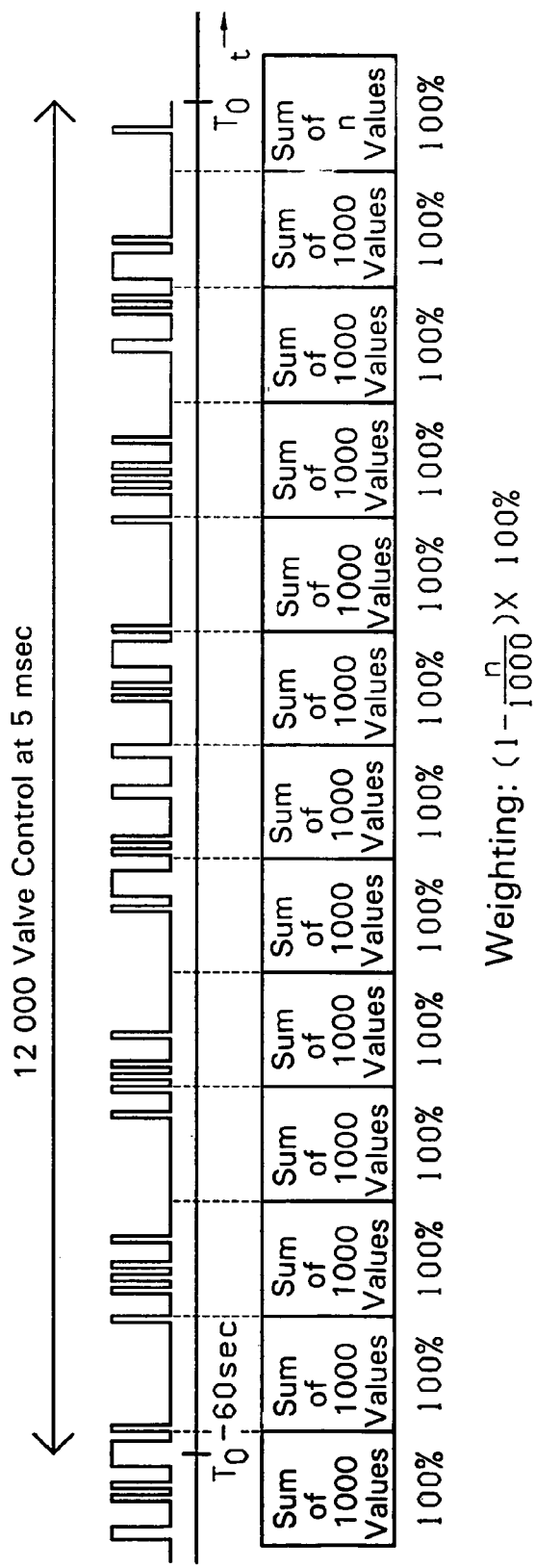

METHOD FOR CALCULATING THE OPERATING TIME OF HYDRAULIC COMPONENTS

Figure 1:
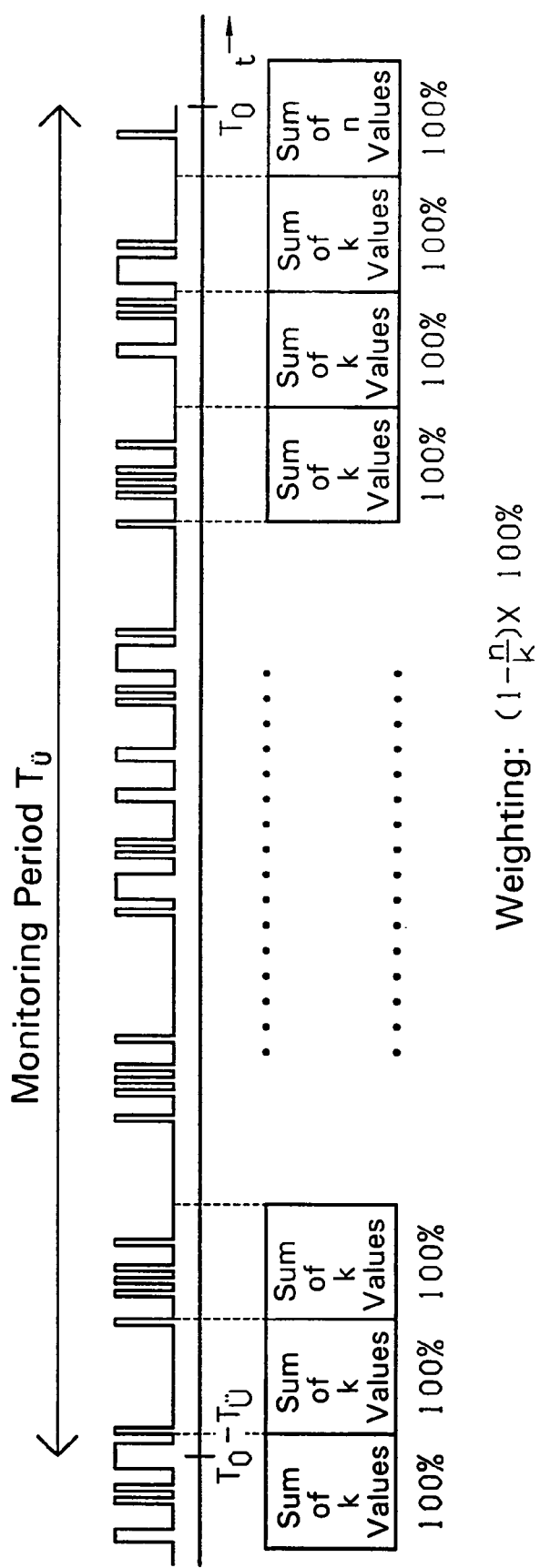

This application es a national stage completion of PCT/EP02/13978 filed Dec. 10, 2002 which claims priority from German Application Serial No. 101 61 742.9 filed Dec. 15, 2001.

FIELD OF THE INVENTION

This invention relates to a method for calculating the operating time of hydraulic, electrohydraulic or electric components of a motor vehicle or of a working machine.

Certain hydraulic, electrohydraulic or electric components of a motor vehicle or of a working machine, such as valves or pumps, usually are not laid out with fatigue limit so that a maximum admissible operating time (ED) is indicated within a reference period. To make possible the elimination of damage of said components due to permanent control, the control devices or control software concerned must know the actual operating time (ED) at the moment at which a control signal is generated.

For determining the actual operating time, it is required that one component be controlled beginning from the present moment up to the moment lying back by the reference period. If the control device generates a control signal, for example, every 5 ms, the operating time in a reference period of 60 seconds, for example, 12000 individual values, has to be taken into account for calculating. Therefore, to exactly determine the operating time, the values have to be separately stored for each component. The storage place, as a rule, is not available in a control device for reasons of cost.

The problem on which this invention is based is to outline a method for determining the actual operating time of a hydraulic, electrohydraulic or electric component of a motor vehicle or of a working machine, which makes determining the actual operating time as precisely as possible in case of storage place need clearly smaller than the method according to the prior art.

It is accordingly proposed that an approximation method is used for calculating the actual operating time.

SUMMARY OF THE INVENTION

In particular, the monitoring period or the reference period is divided into separate intervals or time windows which correspond to a certain number of program or control runnings; there is coordinated with each time window one value which is increased by the momentary control period. The operating time then results as sum of the values of the individual time windows; it is possible to provide one or more windows with weighting factors.

The inventive method considerably reduces the number of values to be stored; it corresponds to the number of time windows and the stored meter.

BRIEF DESCRIPTION OF THE DRAWINGS invention will now be described, by way of example, with reference to the accompanying drawings in which:

FIG. 1 shows a time/signal diagram with the corresponding time windows for a general case; and FIG. 2 is a time/signal diagram with the inventive time windows for a concrete embodiment explained herebelow.

DETAILED DESCRIPTION OF THE INVENTION

As shown in FIG. 1, according to the invention, the monitoring or reference period is divided into individual time windows, each time window having the length of k control or program runnings. The number k can be defined based on the precision of calculation desired to be achieved. The higher k is, the lower the precision obtainable, since several values are combined.

The operating time of the component concerned during one of said time windows is stored as one value, the value of the actual time window being increased with each program running by the momentary control time of the component. After k program runnings, which are detected by a meter n, the time window just expired moves to the second place, the meter is reset and the value of the time window lying farthest back is deleted whereby the storage place that has become free is available for recording the operating time in the new actual time window. The number of time windows does not change all together.

According to the invention, the operating time within the monitoring period is calculated by summing up all values of the individual time windows. One variant of the invention provides weighting of the individual window by means of an appertaining weighting factor.

According to a special advantageous variant of the invention, the time window lying farthest back loses influence as the level (meter n) of the actual time window increases. The time window lying farthest back is weighted with the factor $(1-n/k)$, n representing the meter of the actual time window.

The determination of the number of time windows needed for storing the total operating time in the monitoring period results from the following formula:

$$\text{Number of time windows} = \left(\frac{T_u/T_p}{k}\right) + 1,$$

$T_u$=monitoring period
$T_p$=program running time
k=number of values per time window There results, for example, for a program running time of 5 milliseconds, a monitoring period of 60 seconds and the value 1000 for the factor k 13 time windows with a length of 5 seconds each. The diagram corresponding to these values is object of FIG. 2

As already explained, the precision of the calculation of the operating time is mainly determined by the factor k. Besides, the maximum possible divergence of the calculated value from the real value occurs precisely at the moment of the program running when the condition n=k/2 has been met. The typical maximum values for the errors occurring in such a situation are in the order of ±2.0% and can only be reached by a quite specific control signal for k=1000 and 13 time windows; for the normal case, on the other hand, an error of about ±1.0% is to be expected, a compromise having to be reached between precision and storage need.

REFERENCE NUMERALS $T_u$ monitoring period
$t_p$ program running time
k number of values per time window
n meter

The invention claimed is:

1. A method for determining an operating time of one of a hydraulic, electrohydraulic and electric component of a motor vehicle and of a working machine within one of a reference time and a monitoring period, in which the operating time is determined by an approximation method, the method comprising the steps of:
    dividing one of the monitoring period of the reference time into one of separate intervals or time windows which correspond to a specific number of separate intervals and time windows (k) of a program or control,
    coordinating one value with each separate interval or time window which is increased by a momentary, actual control time and then stored after a plurality of separate intervals or time windows (k) which are detected by a meter (n),
    moving a separate interval or a time window which just expired to a second place,
    generating a new separate interval or time window,
    resetting the meter (n) and deleting a value of a separate interval or a time window lying farthest back, and
    calculating the operating time within one of the reference time and the monitoring period by summing up all values of the individual separate intervals or time windows.

2. The method according to claim 1, further comprising the step of weighing the values of one or more time windows by a weighting factor.

3. The method according to claim 2, further comprising the step of weighing the time window lying farthest back with a factor $(1-n/k)$.

4. A method for determining an operating time of one of a hydraulic, electrohydraulic and electric component of a machine within one of a reference time and a monitoring period, wherein the operating time is determined by an approximation method comprising the steps of:
    dividing one of the monitoring period or the reference time into at least one of separate intervals and time windows which correspond to a specific number of separate intervals or time windows (K) of a running program or control;
    coordinating each of the separate intervals or time windows with a value;
    increasing each value by a momentary actual control time;
    storing the increased value;
    moving a separate intervals or a time window which just expired to a second position after the specific number (k) has been reached, as detected by a meter (n);
    generating a new separate intervals or time window after the separate interval or time window is moved;
    resetting the meter (n) and deleting the separate interval or the time window lying farthest back;
    calculating the operating time within one of the reference time and the monitoring period by summing up all the values of the individual time windows.

* * * * *